United States Patent
Wang

(10) Patent No.: US 9,801,294 B2
(45) Date of Patent: Oct. 24, 2017

(54) ELECTRONIC DEVICE CASING INCLUDING COUPLING STRUCTURE AND METHOD OF MANUFACTURING SAME

(71) Applicant: SUNTENG NEW TECHNOLOGY CO., LTD., Taoyuan County (TW)

(72) Inventor: Wen-Cheng Wang, Taoyuan County (TW)

(73) Assignee: Sunteng New Technology Co., Ltd., Guishan Township, Taoyuan County (TW)

(*) Notice: Subject to any disclaimer, the term of this patent is extended or adjusted under 35 U.S.C. 154(b) by 1062 days.

(21) Appl. No.: 13/689,077

(22) Filed: Nov. 29, 2012

(65) Prior Publication Data

US 2014/0147653 A1 May 29, 2014

(51) Int. Cl.
| | |
|---|---|
| *B28B 3/20* | (2006.01) |
| *H05K 5/02* | (2006.01) |
| *B29C 69/02* | (2006.01) |
| *B29C 45/14* | (2006.01) |
| *H05K 5/00* | (2006.01) |

(Continued)

(52) U.S. Cl.
CPC ..... *H05K 5/0217* (2013.01); *B29C 45/14336* (2013.01); *B29C 69/02* (2013.01); *H05K 5/0034* (2013.01); *B29C 43/183* (2013.01); *B29C 43/20* (2013.01); *B29L 2031/3481* (2013.01); *Y10T 428/249923* (2015.04)

(58) Field of Classification Search
CPC ..... B29C 43/203; B29C 43/206; B29C 49/02; B29C 45/14336; B29C 43/183; B29C 43/20; H05K 5/0217; H05K 5/0034; Y10T 428/249923; B29L 2031/2481

USPC ......... 428/138, 119; 264/241, 319; 220/4.02
See application file for complete search history.

(56) References Cited

U.S. PATENT DOCUMENTS 6,331,263 B1 * 12/2001 Abe ................. B29C 45/14778
264/257
7,025,920 B2 * 4/2006 Pavao ....................... B60R 1/06
264/247

(Continued)

FOREIGN PATENT DOCUMENTS

TW M331441 U 5/2008
TW 201134366 A 10/2011

(Continued)

*Primary Examiner* — J. Gregory Pickett
*Assistant Examiner* — Niki M Eloshway
(74) *Attorney, Agent, or Firm* — Muncy, Geissler, Olds & Lowe, P.C.

(57) ABSTRACT

A method for manufacturing an electronic device casing having a coupling structure is provided. The electronic device casing is made of a casing material including a supportive substrate and a first thermoplastic substrate. A preliminary connecting section is formed on the first thermoplastic substrate by a hot-pressing molding process, and a molding plastic material is injected onto the preliminary connecting section by an in-mold injection process. After being cooled, the molding plastic material engages with the preliminary connecting section to form a secondary connecting section for a coupling element to couple with. Thus, the coupling structure of the electronic device casing can be directly formed during a manufacturing process without any additional procedures, thereby overall manufacturing time and costs are reduced.

9 Claims, 7 Drawing Sheets

(51) Int. Cl.
*B29C 70/84* (2006.01)
*B29L 31/34* (2006.01)
*B29C 43/18* (2006.01)
*B29C 43/20* (2006.01)

(56) References Cited

U.S. PATENT DOCUMENTS

| | | | |
|---|---|---|---|
| 7,767,289 B2* | 8/2010 | Sekine | B29C 45/14688 |
| | | | 106/31.13 |
| 8,173,238 B2* | 5/2012 | Okano | B29C 45/14311 |
| | | | 428/58 |
| 2009/0283940 A1* | 11/2009 | Oosaki | B29C 51/002 |
| | | | 264/553 |
| 2010/0143648 A1* | 6/2010 | Tsai | B29C 45/14311 |
| | | | 428/138 |
| 2010/0143650 A1* | 6/2010 | Tsai | B29C 66/304 |
| | | | 428/139 |
| 2012/0168990 A1* | 7/2012 | Kuwahara | B29C 33/08 |
| | | | 264/404 |
| 2013/0127092 A1* | 5/2013 | Dauner | B29C 44/1228 |
| | | | 264/415 |

FOREIGN PATENT DOCUMENTS

| | | |
|---|---|---|
| TW | 201134653 A | 10/2011 |
| TW | 420969 B | 2/2012 |

* cited by examiner

ELECTRONIC DEVICE CASING INCLUDING COUPLING STRUCTURE AND METHOD OF MANUFACTURING SAME

FIELD OF THE INVENTION

The present invention relates to an electronic device casing including a coupling structure and a method of manufacturing same, and particularly to a method for manufacturing an electronic device casing including a coupling structure which is formed on a first thermoplastic substrate by a hot-pressing molding process in conjunction with an in-mold injection process.

BACKGROUND OF THE INVENTION

To stimulate purchase desires of consumers, in addition to pursuing outstanding function performance, manufacturers of industrial products provide the products in diversified novel appearance designs that are not only appealing to consumers but also enhance added values of the products. Taking a casing of an electronic device as an example, casings in earlier days are commonly made of plastic materials through an injection molding process. Although having advantages of being light in weight and high in formability, plastics suffer from an issue of unsatisfactory heat dissipation and are also likely to leave consumers an impression of an inferior quality. Therefore, certain manufacturers of making casings replace plastic materials by metal such as a magnesium alloy, an aluminum alloy or a titanium alloy. However, a coupling structure cannot be directly formed on the casing made of metal for coupling with an external element (e.g., a circuit board or a bracket). Alternatively, the coupling structure can only be disposed onto the casing by means of adhesion or welding as disclosed in Taiwan Patent Nos. M331441 and 420969 as well as Taiwan Publication Nos. 201134366 and 201134653. In the above disclosures, although an issue of not being able to directly form a coupling structure is solved, adhesion or welding of the coupling structure requires extremely precise positioning to ensure that an external element can be steadily coupled with the casing, which makes the manufacturing process of the casing complex and lengthens manufacturing time thereof.

SUMMARY OF THE INVENTION

Therefore the primary object of the present invention is to overcome an issue of complex manufacturing process that is caused because a coupling structure cannot be directly formed on a casing of an electronic device made of metal.

To achieve the above object, a method for manufacturing an electronic device casing having a coupling structure is provided. The method comprises the following steps.

In step (a), a casing material is provided. The casing material comprises a supportive substrate and a first thermoplastic substrate stacked on a surface of the supportive substrate.

In step (b), a hot-pressing molding process is performed. The first thermoplastic substrate is hot-pressed by a first hot-pressing mold having at least one hot-pressing molding section, such that the first thermoplastic substrate is bonded to the supportive substrate to form a preliminary connecting section at a position where the hot-pressing molding section is located.

In step (c), an in-mold injection process is performed. The bonded first thermoplastic substrate and supportive substrate are placed in an injection mold. A molding plastic material is injected into the injection mold to engage with the preliminary connecting section to form a secondary connecting section for a coupling element to couple with.

In the method according to an embodiment of the present invention, in the step of providing the casing material, one surface of the supportive substrate away from the first thermoplastic substrate is further stacked by a second thermoplastic substrate. Further, the second thermoplastic substrate is made of a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon, and is formed at a thickness between 0.1 mm and 0.5 mm. Further, in the step of performing the hot-pressing molding process, the second thermoplastic substrate may be hot-pressed by a second hot-pressing mold, such that the second thermoplastic substrate is bonded to the supportive substrate.

In the method according to an embodiment of the present invention, the first thermoplastic substrate may be made a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon.

In the method according to an embodiment of the present invention, the first thermoplastic substrate is formed at a thickness between 0.2 mm and 0.5 mm. Further, the supportive substrate is made of a material selected from the group consisting of metal, fiber, carbon fiber, plant fiber and leather, and is formed at a thickness between 0.1 mm and 1 mm.

An electronic device casing including a coupling structure is further provided by the foregoing method according to an embodiment of the present invention. The electronic device casing is made of a casing material comprising a supportive substrate and a first thermoplastic substrate bonded to a surface of the supportive substrate. The coupling structure comprises a preliminary connecting section extended from the first thermoplastic substrate and a secondary connecting section engaging with the preliminary connecting section for a coupling element to couple with.

Further, the secondary connecting section has a screw end for screwing the coupling element, a rivet terminal for riveting the coupling element, or an insertion end for inserting the coupling element. Further, the supportive substrate is formed at a thickness between 0.1 mm and 1 mm.

In the method for manufacturing an electronic device casing including a coupling structure of the present invention, the preliminary connecting section is formed on the first thermoplastic substrate by the hot-pressing molding process, and the molding plastic material is then injected onto the preliminary connecting section by the in-mold injection process. After being cooled, the molding plastic material engages with the preliminary connecting section to form the secondary connecting section, such that the coupling structure is formed. Thus, the coupling structure can be directly formed during the manufacturing process of the electronic device casing without any additional procedures. Therefore, the coupling structure provided by the present invention is suitable for mass production due to a simplified manufacturing process and shortened manufacturing time.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
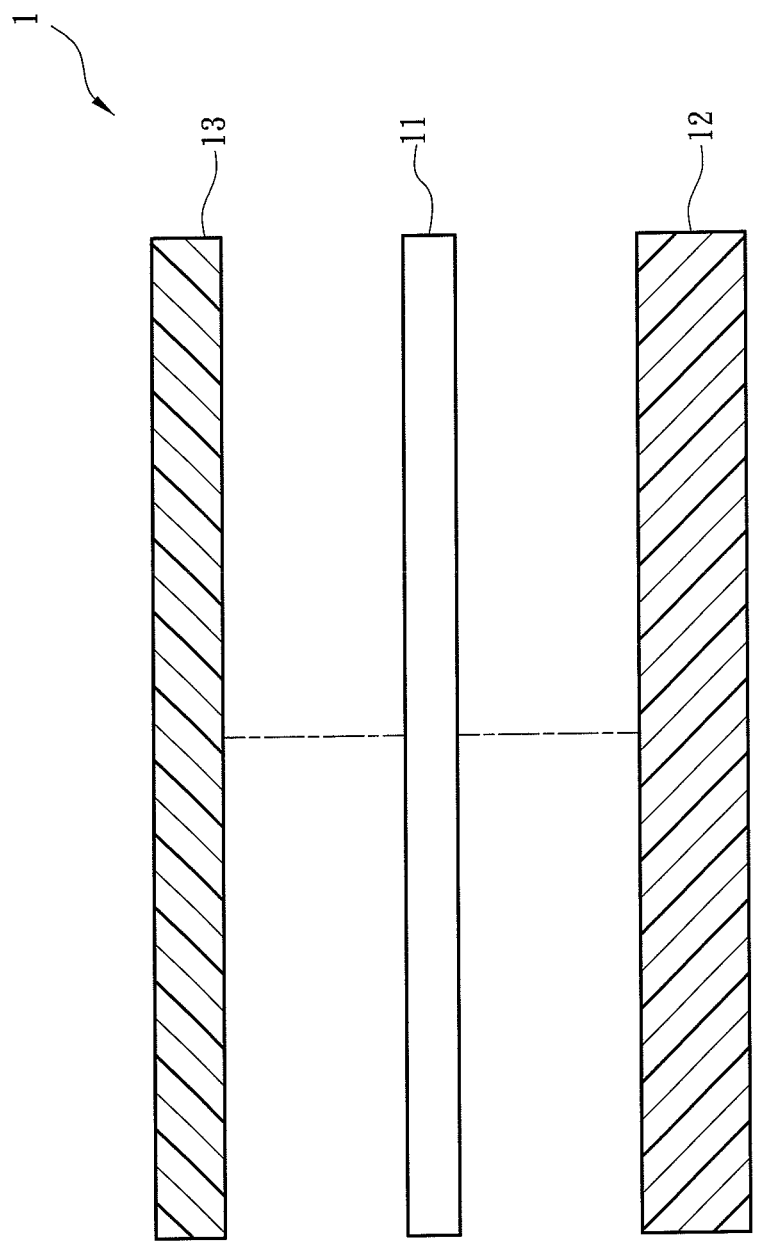
FIG. 1A is an exploded sectional view of a casing material of an electronic device casing including a coupling structure according to an embodiment of the present invention.
Figure 2:
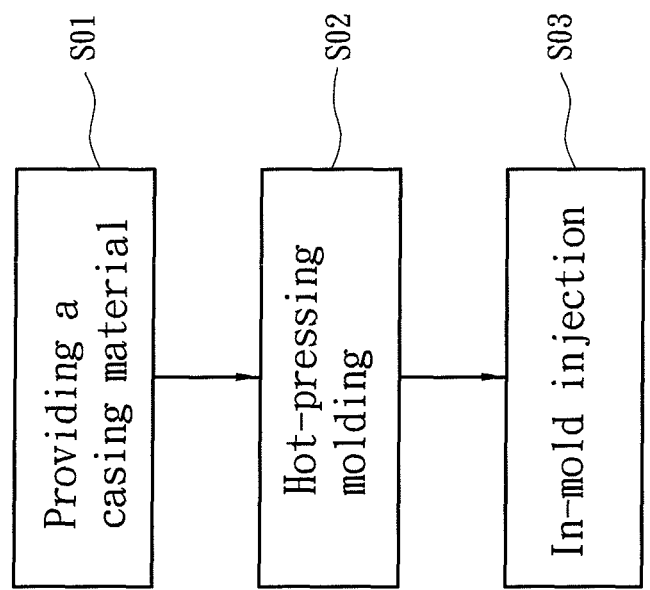
FIG. 2 is a flowchart of a method for manufacturing an electronic device casing including a coupling structure according to an embodiment of the present invention.

Referring to FIG. 1A and FIG. 2, an electronic device casing including a coupling structure according to an embodiment of the present invention is used for coupling with a circuit board (not shown) or a bracket (not shown) of an electronic device. The coupling structure is directly disposed on a surface of the electronic device casing, and so an issue of a conventional coupling structure disposed on the electronic device casing through welding or adhesion can be solved. The electronic device casing is made of a casing material 1. The casing material 1 comprises a supportive substrate 11, and a first thermoplastic substrate 12 stacked on a surface of the supportive substrate 11. The supportive substrate 11 may be made of a material selected from the group consisting of metal, fiber and carbon fiber. The first thermoplastic substrate 12 may be made of a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon. Further, the supportive substrate 11 is formed at a thickness between 0.1 mm and 1 mm, and the first thermoplastic substrate 12 is formed at a thickness between 0.2 mm and 0.5 mm. Apart from the above-mentioned common materials, the supportive substrate 11 may further be made of plant fiber or leather. For example, the plant fiber can be bamboo skin or tree bark, and the leather can be synthetic leather.

Referring to FIG. 2, a method for manufacturing the electronic device casing by the casing material 1 according to an embodiment of the present invention comprises the following steps.

In step S01, a casing material is provided. That is, the casing material 1 comprising the supportive substrate 11 and the first thermoplastic substrate 12 is provided.

Figure 1B:
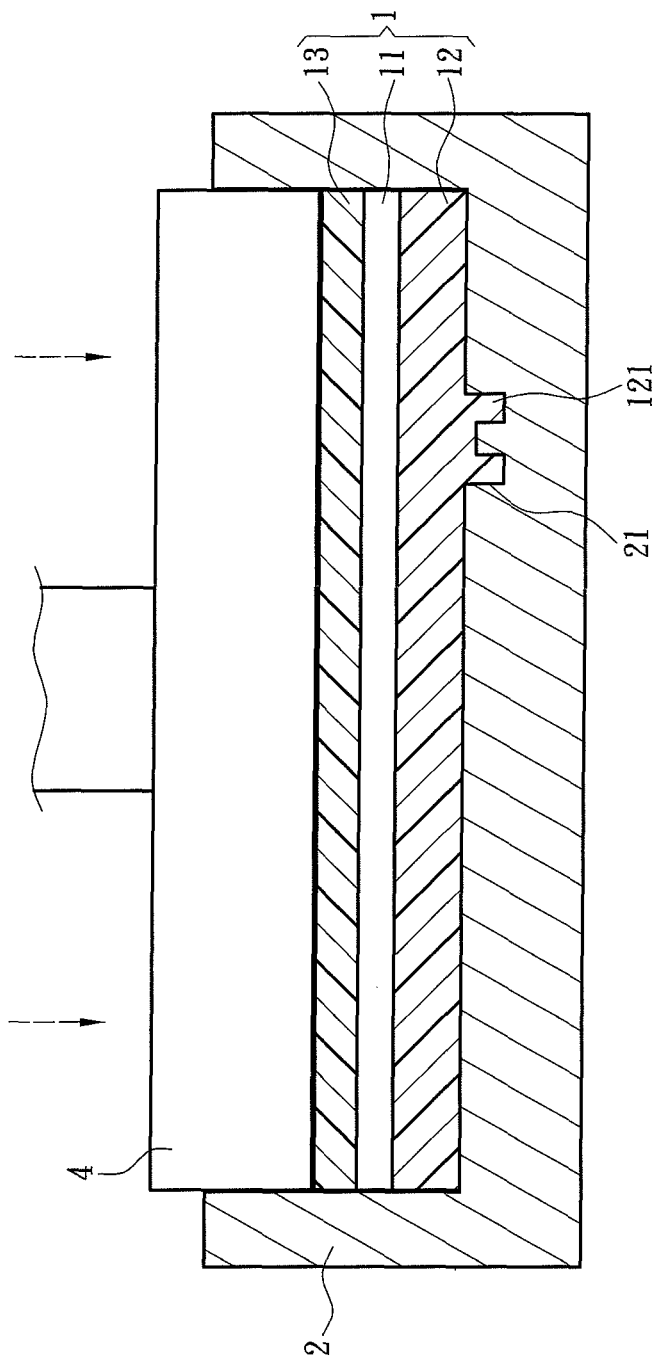
FIG. 1B is a schematic diagram of manufacturing an electronic device casing including a coupling structure by a hot-pressing molding process according to an embodiment of the present invention.
Figure 1C:
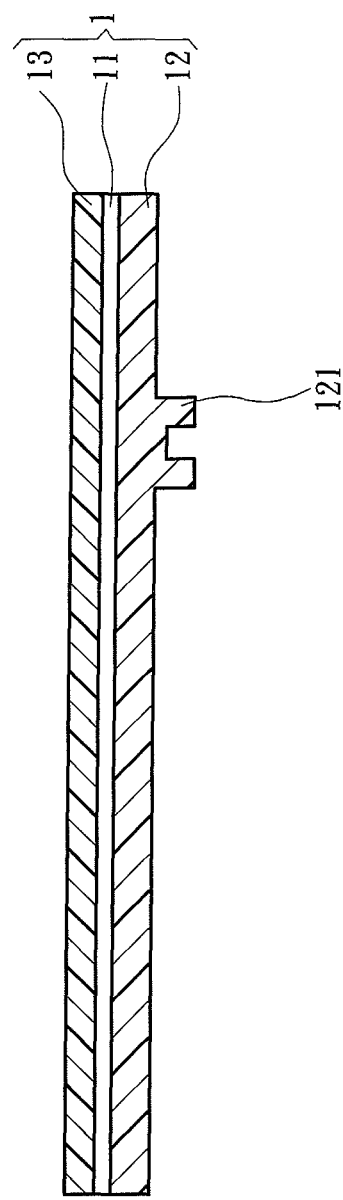
FIG. 1C is a sectional view of a casing material of an electronic device casing including a coupling structure after the hot-pressing molding process according to an embodiment of the present invention.

In step S02, a hot-pressing molding process is performed. Referring to FIG. 1B, the first thermoplastic substrate 12 is hot-pressed by a first hot-pressing mold 2. The first hot-pressing mold 2 comprises at least one hot-pressing molding section 21 whose type may be appropriately modified according to actual requirements and is not limited to details depicted in FIG. 1B. During the hot-pressing process, the first thermoplastic substrate 12 is heated and melted to bond to the supportive substrate 11. Further, the first thermoplastic substrate 12 may be hot-pressed to form a physical appearance of the electronic device casing, and a preliminary connecting section 121 is extended from the first thermoplastic substrate 12 and at a position where the hot-pressing molding section 21 is located. The state of the casing material 1 after the hot-pressing molding process is as shown in FIG. 1C.

Figure 1D:
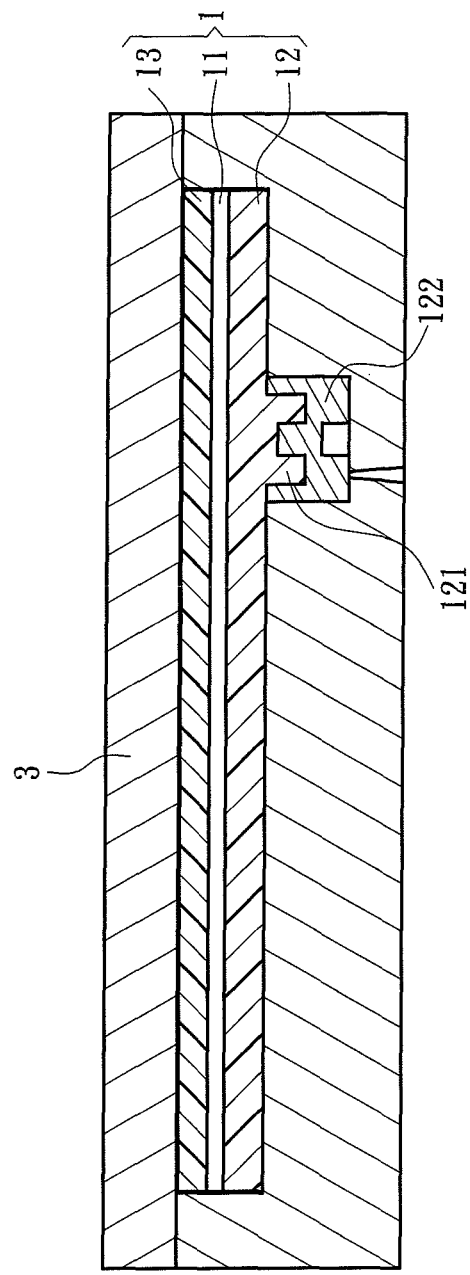
FIG. 1D is a schematic diagram of manufacturing an electronic device casing including a coupling structure by an in-mold injection process according to an embodiment of the present invention.
Figure 1E:
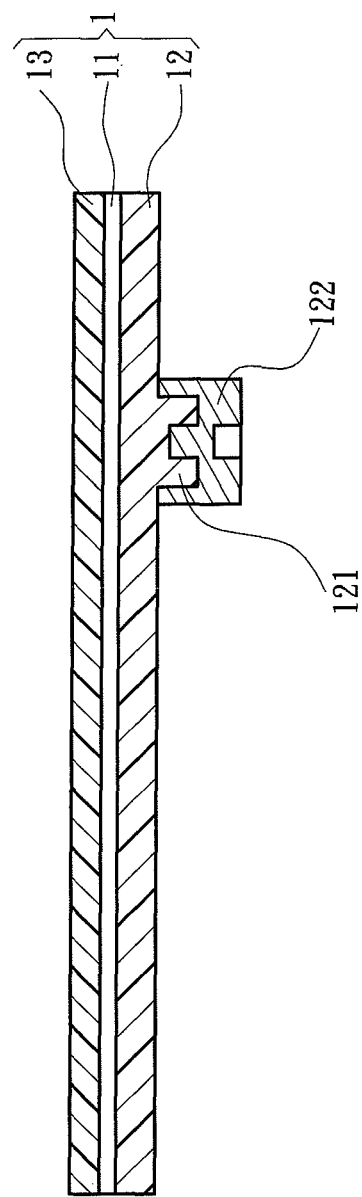
FIG. 1E is a sectional view of a casing material of an electronic device casing including a coupling structure after the in-mold injection process according to an embodiment of the present invention.
Figure 3:
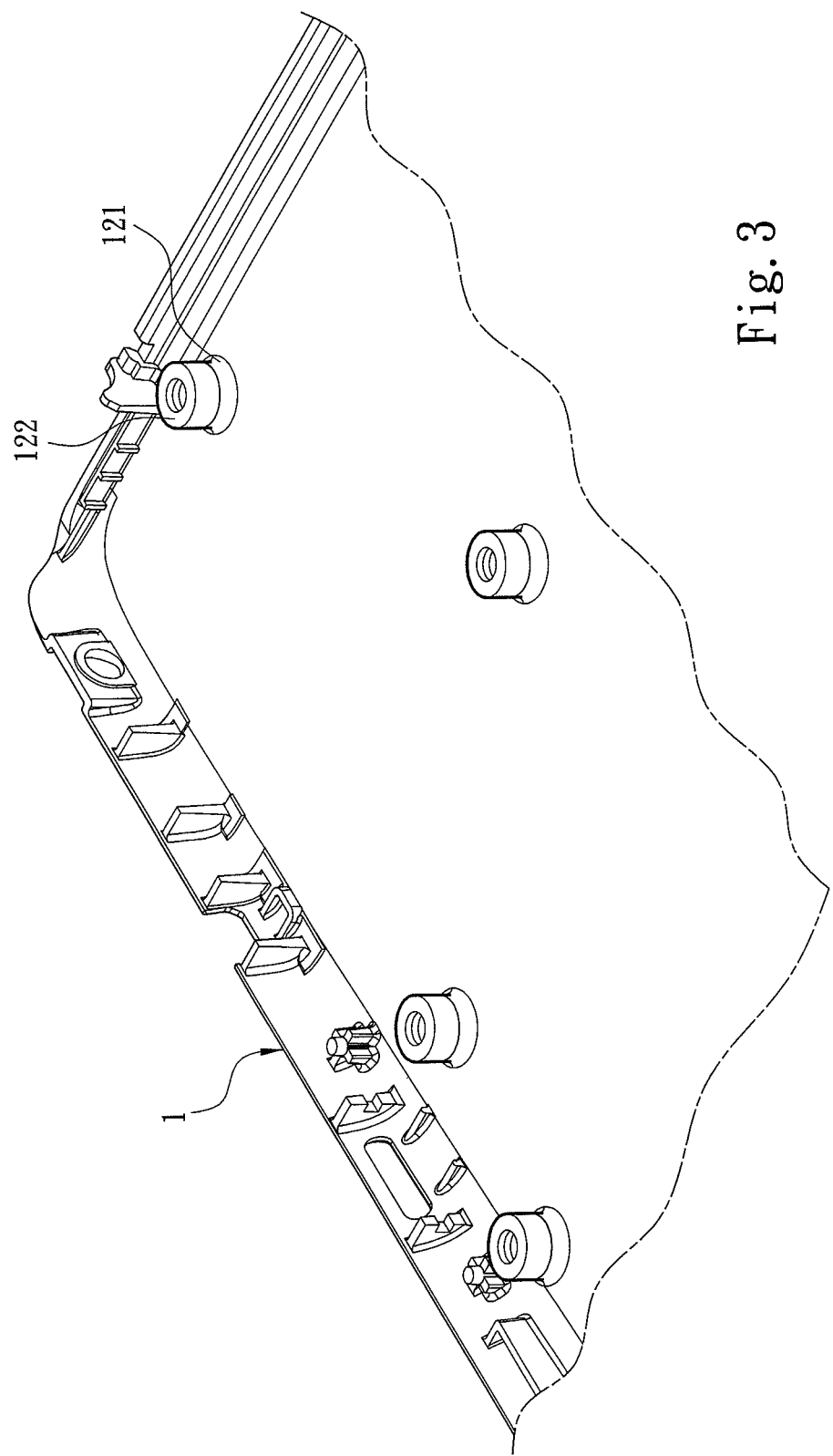
FIG. 3 is a perspective view of an electronic device casing including a coupling structure according to an embodiment of the present invention.

In step S03, an in-mold injection process is performed. Referring to FIG. 1D, FIG. 1E and FIG. 3, the bonded first thermoplastic substrate 12 and supportive substrate 11 are placed in an injection mold 3. A molding plastic material is injected onto the preliminary connecting section 121 of the first thermoplastic substrate 12. After being cooled, the molding plastic material engages with the preliminary connecting section 121 to form a secondary connecting section 122 for a coupling element (not shown) to couple with. Thus, the electronic device casing is formed after the casing material 1 have undergone the in-mold injection process in step S03 and released from the injection mold 3. Further, the secondary connecting section 122 may be formed in various forms according to different coupling elements. For example, the secondary connecting section 122 may have a screw end for screwing the coupling element when the coupling element is a screw element, a rivet end for riveting the coupling element when the coupling element is a rivet element, or an insertion end for inserting the coupling element when the coupling element is an insertion element. Further, before the in-mold injection process in step S03 is performed, a connecting element may be disposed on the preliminary connecting section 121. During the in-mold injection process in step S03, the connecting element of the secondary connecting section 122 is encased by the molding plastic material to further couple with the coupling element.

Again referring to FIG. 1A to FIG. 1E, the casing material 1 may further comprise a second thermoplastic substrate 13 which is stacked on one surface of the supportive substrate 11 away from the first thermoplastic substrate 12. More specifically, the second thermoplastic substrate 12 may be made of a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon. Further, the second thermoplastic substrate 13 is formed at a thickness between 0.1 mm and 0.5 mm. During the hot-pressing molding process in step S02 in the method for manufacturing the electronic device casing, the second thermoplastic substrate 13 is hot-pressed by a second hot-pressing mold 4 and melted and bonded to the supportive substrate 11. Thus, the first thermoplastic substrate 12 and the second thermoplastic substrate 13 respectively form a decorative surface and an assembling surface of the electronic device casing.

In conclusion, the coupling structure of the present invention is not disposed on the electronic device casing by an additional process of adhesion or welding as in the prior art, but is directly formed on the first thermoplastic substrate by the hot-pressing molding process and the in-mold injection process. Therefore, the coupling structure provided by the present invention is more suitable for mass production due to a simplified manufacturing process.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for manufacturing an electronic device casing including a coupling structure, comprising the steps of:
   providing a casing material, wherein the casing material comprises a supportive substrate and a first thermoplastic substrate, the supportive substrate being stacked on a first surface of the first thermoplastic substrate;
   performing a hot-pressing molding process, wherein the first thermoplastic substrate is hot-pressed by a first hot-pressing mold which includes at least one hot-pressing molding section, such that the first thermoplastic substrate is bonded to the supportive substrate and that, while maintaining the first surface of the first thermoplastic substrate planar, a preliminary connecting section is formed on a second surface of the first thermoplastic substrate that is opposite from the first surface, the preliminary connecting section protruding from the second surface of the first thermoplastic substrate at a position where the hot-pressing molding section is located; and
   performing an in-mold injection process, wherein the bonded first thermoplastic substrate and supportive substrate are placed in an injection mold, a molding plastic material is injected into the injection mold to wrap only the preliminary connecting section to form a secondary connecting section on the second surface of the first thermoplastic substrate for a coupling element to couple with.

2. The method of claim 1, wherein in the step of providing the casing material, the casing material further comprises a second thermoplastic substrate which is stacked on one surface of the supportive substrate away from the first thermoplastic substrate.

3. The method of claim 2, wherein in the step of performing the hot-pressing molding process, the second thermoplastic substrate is hot-pressed by a second hot-pressing mold such that the second thermoplastic substrate is bonded to the supportive substrate.

4. The method of claim 2, wherein the second thermoplastic substrate is made of a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon.

5. The method of claim 2, wherein the second thermoplastic substrate is formed at a thickness between 0.1 mm and 0.5 mm.

6. The method of claim 1, wherein the first thermoplastic substrate is made of a material selected from the group consisting of polyethylene terephthalate (PET), polyethylene naphthalate (PEN), polyethylene glycol-co-cyclohexane-1,4 dimethanol terephthalate (PETG), thermoplastic polyurethane (TPU), polyurethane (PU), polypropylene (PP), polycarbonate (PC), amorphous polyethylene terephthalate (APET), polyvinyl chloride (PVC), acrylic, methyl methacrylate styrene (MS), acrylonitrile-butadiene-styrene (ABS) copolymer, polystyrene (PS), polyoxymethylene (POM) and nylon.

7. The method of claim 1, wherein the supportive substrate is made of a material selected from the group consisting of metal, fiber, carbon fiber, plant fiber and leather.

8. The method of claim 1, wherein the supportive substrate is formed at a thickness between 0.1 mm and 1 mm.

9. The method of claim 1, wherein the first thermoplastic substrate is formed at a thickness between 0.2 mm and 0.5 mm.

* * * * *